(12) United States Patent
Kraft et al.

(10) Patent No.: US 9,706,637 B2
(45) Date of Patent: Jul. 11, 2017

(54) METHOD FOR PRODUCING A CIRCUIT BOARD SYSTEM

(71) Applicant: Harman Becker Automotive Systems GmbH, Karlsbad (DE)

(72) Inventors: Guenther Kraft, Karlsruhe (DE); Stephan Joos, Karlsbad (DE); Krunoslav Orcic, Karlsbad (DE); Walter Knappich, Karlsbad (DE); Didier Berthomier, Karlsbad (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 832 days.

(21) Appl. No.: 13/973,785

(22) Filed: Aug. 22, 2013

(65) Prior Publication Data

US 2014/0063748 A1 Mar. 6, 2014

(30) Foreign Application Priority Data

Aug. 31, 2012 (EP) .................................... 12182566

(51) Int. Cl.
*H05K 3/34* (2006.01)
*H05K 1/02* (2006.01)
(Continued)

(52) U.S. Cl.
CPC ....... *H05K 1/0203* (2013.01); *H01L 21/4853* (2013.01); *H01L 23/42* (2013.01);
(Continued)

(58) Field of Classification Search
CPC . H01L 2224/16225; H01L 2924/19105; H01L 23/42; H01L 21/4853; H01L 23/552; H05K 13/0465; H05K 1/024; H05K 3/3484; H05K 2201/10371; H05K 2203/1572; H05K 1/0203; H05K 1/0204

USPC ......... 29/831, 832, 840, 841, 844, 846, 851, 29/854
See application file for complete search history.

(56) References Cited

U.S. PATENT DOCUMENTS 4,541,893 A * 9/1985 Knight .............. H01L 21/76885
204/192.35
6,377,472 B1 4/2002 Fan
(Continued)

FOREIGN PATENT DOCUMENTS

| CN | 102612307 A | 7/2012 |
| EP | 1933609 A1 | 6/2008 |
| WO | 2006001087 A1 | 1/2006 |

OTHER PUBLICATIONS

European Search Report for corresponding Application No. 12182566.5, mailed Mar. 1, 2013, 8 pages.
(Continued)

*Primary Examiner* — Paul D Kim
(74) *Attorney, Agent, or Firm* — Brooks Kushman P.C.

(57) ABSTRACT

Methods for producing a circuit board system and a circuit board arrangement are disclosed. One method for producing a circuit board system includes: providing a first circuit board including a top side, a bottom side, a top metallization layer arranged at the top side, and a bottom metallization layer arranged at the bottom side, wherein the bottom metallization layer comprises a number of soldering pads; applying a first solder over the soldering pads; and applying a second solder over the top metallization layer. The method further includes providing a number of electronic components and a metallic or metallized shielding frame; arranging the number of electronic components and the shielding frame on the applied second solder; and soldering the number of electronic components and the shielding frame to the top metallization layer with the second solder.

9 Claims, 9 Drawing Sheets

(51) Int. Cl.
  *H01L 23/42* (2006.01)
  *H01L 21/48* (2006.01)
  *H01L 23/552* (2006.01)
  *H05K 13/04* (2006.01)

(52) U.S. Cl.
  CPC ......... *H01L 23/552* (2013.01); *H05K 1/0204* (2013.01); *H05K 1/024* (2013.01); *H05K 3/3484* (2013.01); *H05K 13/0465* (2013.01); *H01L 2224/16225* (2013.01); *H01L 2924/19105* (2013.01); *H05K 2201/10371* (2013.01); *H05K 2203/1572* (2013.01)

(56) References Cited

U.S. PATENT DOCUMENTS

| | | | | |
|---|---|---|---|---|
| 6,495,406 | B1 * | 12/2002 | Honeycutt | H01L 21/28044 257/E21.198 |
| 6,803,304 | B2 * | 10/2004 | Asami | H01L 21/76807 257/E21.508 |
| 7,262,369 | B1 * | 8/2007 | English | H01L 23/04 174/370 |
| 7,292,459 | B2 * | 11/2007 | Wang | H05K 9/0032 174/352 |
| 7,638,717 | B1 | 12/2009 | Yeates et al. | |
| 8,097,489 | B2 * | 1/2012 | Pagaila | H01L 21/561 438/106 |
| 8,581,109 | B2 * | 11/2013 | Tuominen | H01L 21/4846 174/260 |
| 2003/0143971 | A1 | 7/2003 | Hongo et al. | |
| 2003/0218238 | A1 | 11/2003 | Kikuchi et al. | |
| 2008/0296735 | A1 | 12/2008 | Takehara et al. | |
| 2011/0255250 | A1 | 10/2011 | Dinh et al. | |

OTHER PUBLICATIONS

Chinese Office Action for corresponding Application No. 201310313898.3, mailed Jul. 5, 2016, 7 pages.

Chinese Office Action and English translation for Application No. 201310313898.3, dated Mar. 10, 2017, 15 pages.

\* cited by examiner

METHOD FOR PRODUCING A CIRCUIT BOARD SYSTEM

CROSS-REFERENCE TO RELATED APPLICATIONS

This application claims priority to EP Application No. 12 182 566.5-1806, filed Aug. 31, 2012, the disclosure of which is incorporated in its entirety by reference herein.

TECHNICAL FIELD

Disclosed herein is a circuit board system as can be used, for instance, in an infotainment head unit or in a telematics unit, and a method for producing a circuit board system.

BACKGROUND

Modular circuit board systems with two or more electrically interconnected circuit boards are becoming more and more popular as the modularity of such arrangements allows swiftly amending or adapting existing technologies. In many conventional circuit board systems, the connections between individual circuit boards are implemented as plug-in connections. However, plug-in technology is expensive as it requires plugs and sockets. Aside from that, plug and socket technology occupies a lot of space on the circuit boards. If, on the other hand, soldered connections are used instead of plug-in technology, the operating temperature of the system is limited in range and/or cycles. At increased temperatures and temperature cycles, the failure probability is significantly higher than for systems that use plug-in technology. Hence there is a need for an improved circuit board system.

SUMMARY

In a method for producing a circuit board system is provided a first circuit board with a top side, a bottom side, a top metallization layer arranged at the top side, and a bottom metallization layer arranged at the bottom side. The bottom metallization layer includes a number of soldering pads. A first solder is applied over the soldering pads and a second solder is applied over the top metallization layer. Also included are a number of electronic components, and a metallic or metallized shielding frame that has an opening. The number of electronic components and the shielding frame are arranged on the applied second solder and soldered to the top metallization layer by melting the second solder and by subsequently cooling of the second solder to below its solidification temperature. After cooling, a thermal interface material is applied through the opening over the top side of at least one of the electronic components.

Optionally, a housing cover with an electrically conductive surface may be attached to the first circuit board such that the contact springs electrically contact the housing cover and that the thermal interface material mechanically contacts the housing cover and at least one of the electronic components.

In order to further produce a circuit board arrangement, a second circuit board with a top side, a bottom side and a top metallization layer arranged at the top side is provided. The soldering pads are electrically and mechanically connected to the top metallization layer of the second circuit board by soldering.

BRIEF DESCRIPTION OF THE DRAWINGS

Various specific examples are described in more detail below based on the principles illustrated in the figures of the drawings. Unless stated otherwise, similar or identical components are labeled in all of the figures with the same reference numbers.

DETAILED DESCRIPTION

Figure 1:
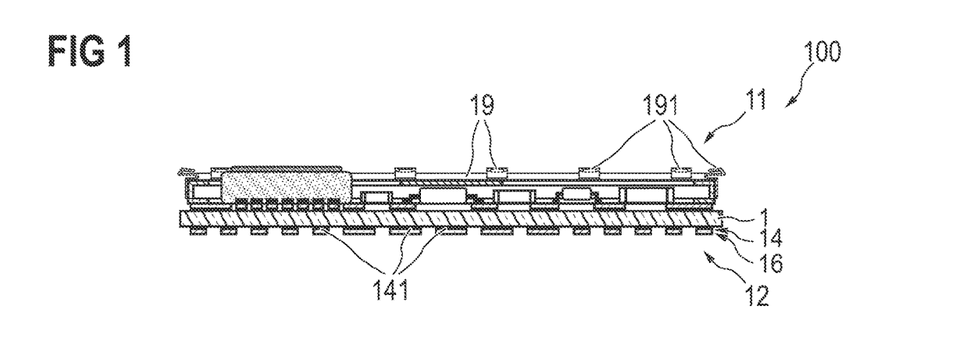
FIG. 1 is a cross-sectional view of a circuit board system which is a land grid array (LGA) module.

FIG. 1 illustrates a circuit board system 100 with a first circuit board 1. The first circuit board 1 has a top side 11 and a bottom side 12. A top metallization layer 13 is arranged at the top side 11 and a bottom metallization layer 14 is arranged at the bottom side 12. In the bottom metallization layer 14, a number of soldering pads 141 are formed. A first solder 16 is arranged on the soldering pads 141 such that the first solder 16 completely covers the soldering pads 141. A number of electronic components 17 and a shielding frame 18 are soldered to the top metallization layer 13 using a second solder 15. A spring frame 19, which has an electrically conductive surface and several electrically conductive contact springs 191, is snapped onto the shielding frame 18.

In order to form a more complex circuit board arrangement, such a circuit board system 100 may be, prior to or after snapping the spring frame 19 onto the shielding frame 18, soldered together with other electronic components to a second circuit board. For instance, such a circuit board arrangement may form an infotainment head unit or a telematic unit of a vehicle. However, the invention is not limited to infotainment head units or telematic units and/or the use in vehicles.

Figure 2:
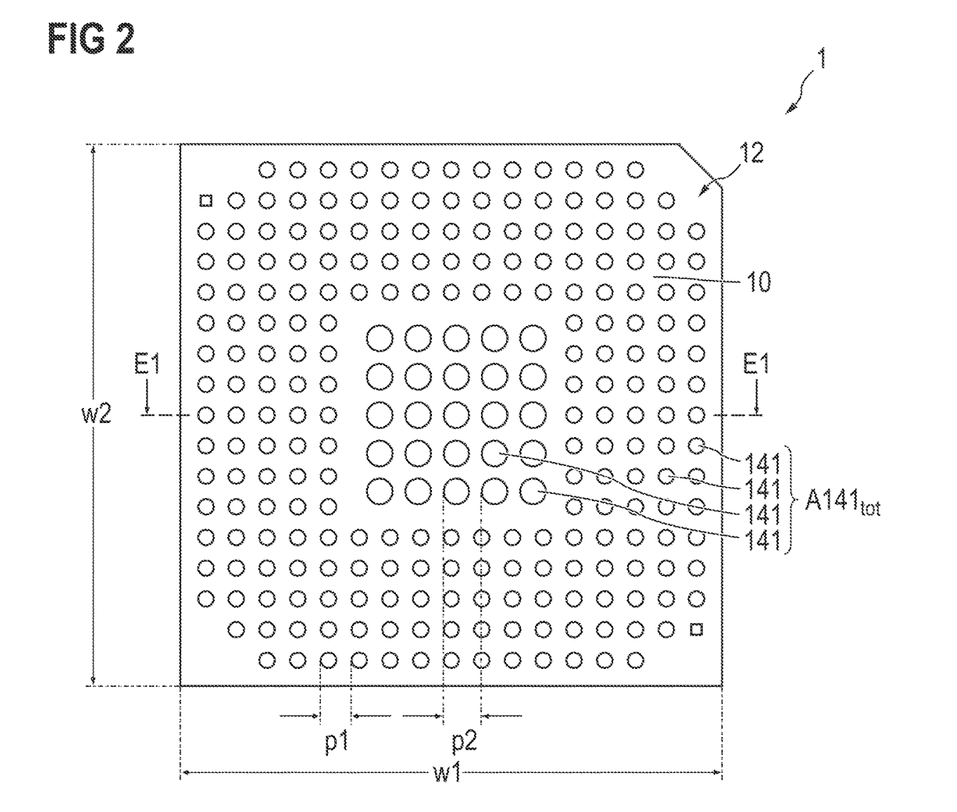
FIG. 2 is a bottom view of a circuit board of the circuit board system of FIG. 1.

FIG. 2 is a bottom view of the first circuit board 1 of the circuit board system 100. In this case, no first solder 16 is applied over the soldering pads 141. The soldering pads 141 are formed in the bottom metallization layer 14. Also illustrated in FIG. 2 is the cross-sectional plane E1 which corresponds to the view of FIG. 1. Except for the soldering pads 141, the bottom metallization layer 14 is protected with a solder mask 10. In the arrangement of FIG. 1, the solder mask 10 is present but is not shown in FIG. 1. The bottom metallization layer 14 also includes conductor lines for electrically connecting the soldering pads 141. However, the conductor lines are covered by the solder mask 10 and therefore hidden in FIG. 2.

As also illustrated in FIG. 2, the soldering pads 141 may have different sizes. The size may depend on the required capacity & inductance. A first subset of the soldering pads 141 may have a first pitch p1, for instance at least 2.4 mm, and a second subset of the soldering pads 141 may have a second pitch p2, for instance at least 3 mm. The total number of soldering pads 141 has a total surface area A141tot. In this regard, the surface of a soldering pad 141 is the area of the footprint of the pad 141.

The first circuit board 1 itself has a footprint of w1 (length)×w2 (width) which may be, for instance, less than or equal to 70 mm×70 mm. However, the footprint may also exceed the size of 70 mm×70 mm, that is, the length w1 and the width w2 may each be more than 70 mm.

If during the soldering of the first circuit board 1 to a substantially plane second circuit board a significant warpage of the first circuit board 1 occurs, it may happen that some of the soldering pads are not wetted with solder. As a maximum of war page predominantly occurs in the corner regions of the first circuit board 1, the corner regions of the first circuit board 1 may optionally be free of soldering pads 141, which is also illustrated in FIG. 2.

Figure 3:
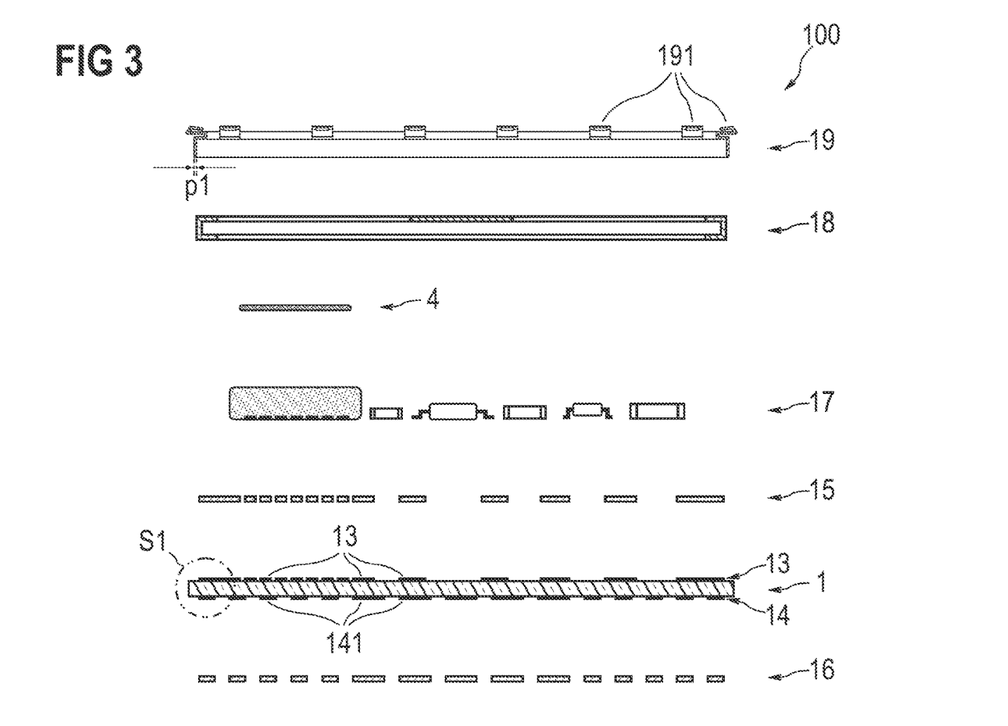
FIG. 3 is an exploded view of the circuit board system of FIG. 1.
Figure 4:
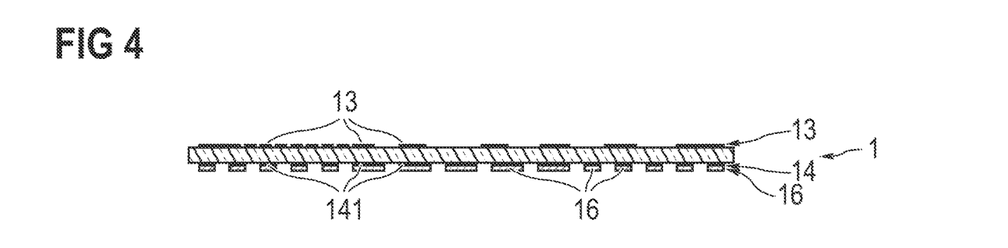
FIGS. 4-9 illustrate different steps of a method for producing the circuit board system as explained above with reference to FIGS. 1 to 3.
Figure 5:
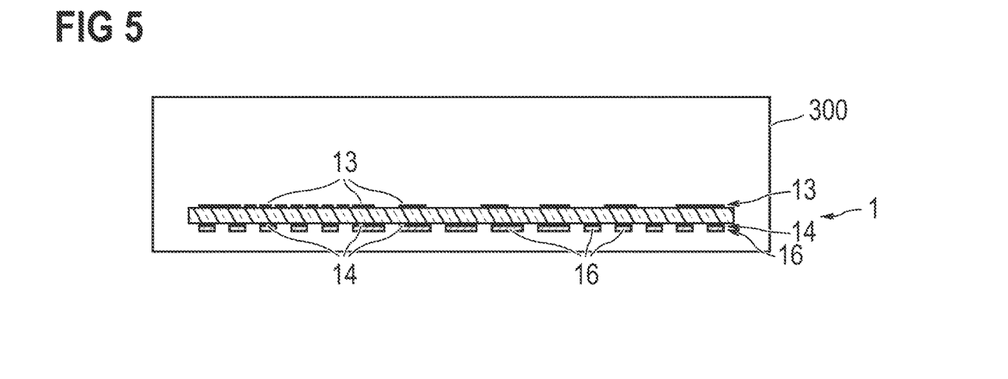

For the sake of clearness, FIG. 3 shows an exploded view of the circuit board system 100 of FIG. 1. As illustrated in FIG. 3, the top and bottom metallization layers 13, 14 form integral parts of the first circuit board 1. In order to produce a circuit board system 100, a first solder 16 (e.g., a soldering paste) is applied over the soldering pads 141, for instance by means of dispensing, screen printing or mask printing. The result is illustrated in FIG. 4. Then, according to FIG. 5, the first circuit board 1 with the first solder 16 applied over the soldering pads 141 is arranged in a reflow soldering machine 300 in which the first solder 16 is melted and subsequently cooled to below its solidification temperature. As a result, the soldering pads 141 are plated with the first solder 16, for instance a solder depot, such that the first circuit board 1 can be handled without the risk of wearing the soldering paste away. Applying the first solder 16 may be carried out using screen printing, stencil printing or jet printing.

Figure 6:
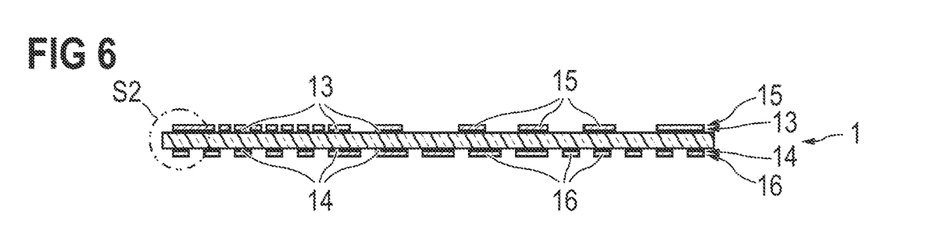
Figure 7:
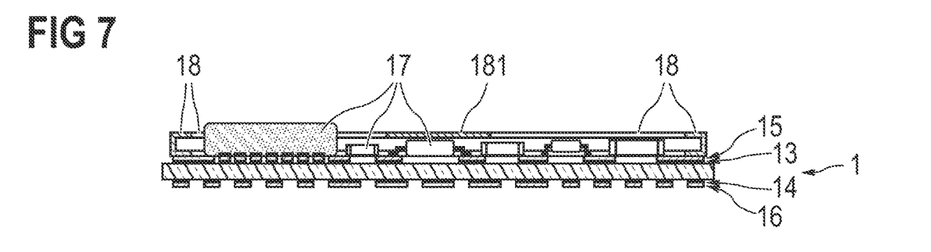

Subsequently, the first circuit board 1 is removed from the reflow soldering machine 300 and a second solder 15 (e.g., a soldering paste) is applied over the top metallization 13, for instance by means of dispensing, screen printing or mask printing. The result is illustrated in FIG. 6. Then, a number of electronic components 17 and a shielding frame 18 are arranged on the applied second solder 15, that is, on the soldering paste, see FIG. 7. For example, the shielding frame 18 may consist of or include nickel (Ni) and/or silver (Ag), or consist of or include an alloy of both nickel (Ni) and silver (Ag).

Figure 8:
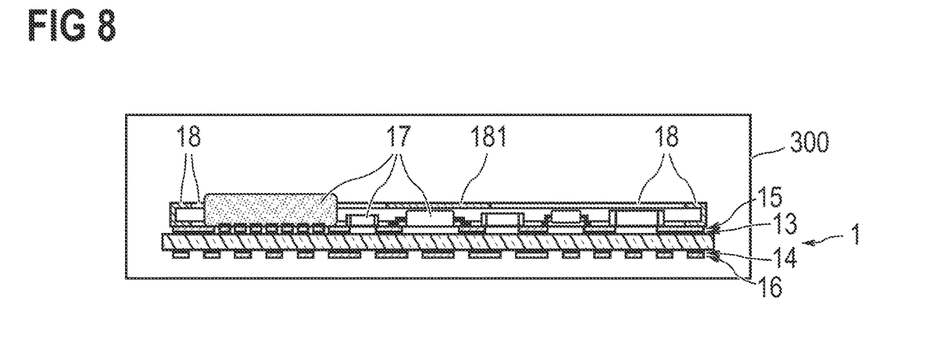

Then, according to FIG. 8, the first circuit board 1 with the number of electronic components 17 and the shielding frame 18 arranged on the applied second solder 15 (i.e., the soldering paste) is arranged in the same or a further reflow soldering machine 300 in which the number of electronic components 17 and the shielding frame 18 are soldered to the top metallization layer 13 by melting the second solder 16 and subsequently cooling the melted solder 16 to below its solidification temperature.

Figure 9:
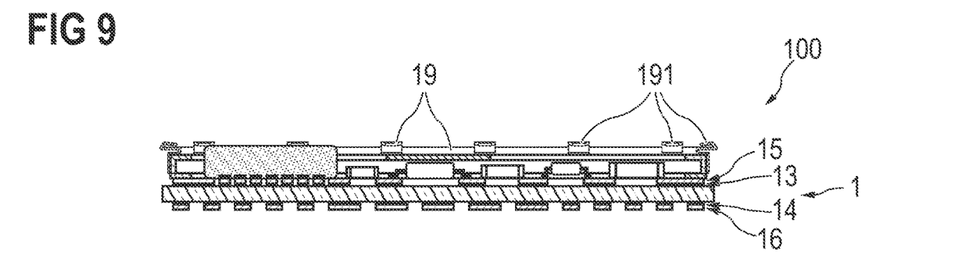

Subsequently, the first circuit board 1 with the number of electronic components 17 and the shielding frame 18 soldered to the top metallization layer 13 may be removed from the reflow soldering machine 300. The result is an electronic subunit 100 which may be soldered to a second circuit board in order to form a circuit board arrangement. Prior to or after soldering the electronic subunit to a second circuit board, the spring frame 19 is snapped onto the shielding frame 18. FIG. 9 shows the subunit 100 with the spring frame 19 snapped onto the shielding frame 18.

Figure 10:
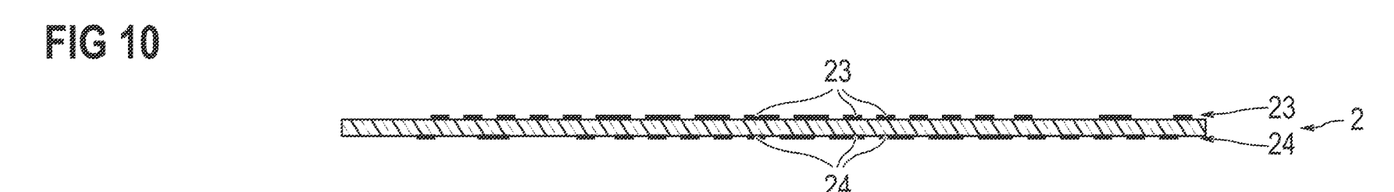
FIGS. 10-16 illustrate different steps of a method for producing a circuit board arrangement.

As will now be explained with reference to FIGS. 10 to 16, using a subunit 100 as explained above, either with or without the spring frame 19 snapped onto the shielding frame 18, a circuit board arrangement 200 (FIG. 16) can be produced by soldering. To this end, a second circuit board 2 as exemplarily illustrated in FIG. 10 is provided. The second circuit board 2 has a top side 21 and a bottom side 22. A top metallization layer 23 is arranged at the top side 21 and an optional bottom metallization layer 24 is arranged at the bottom side 12.

Figure 11:
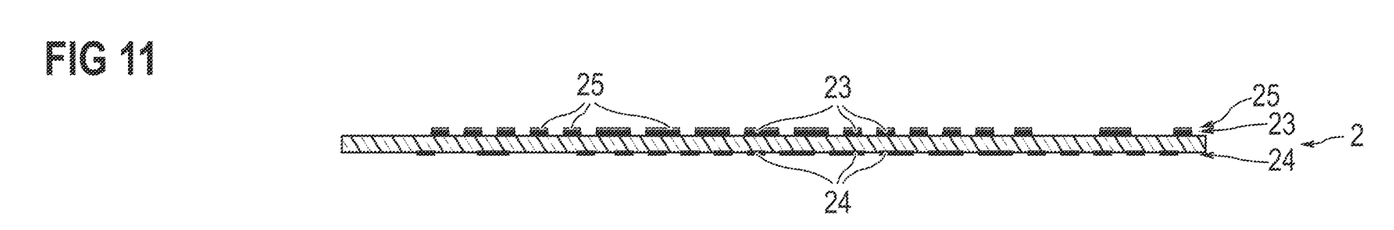
Figure 12:
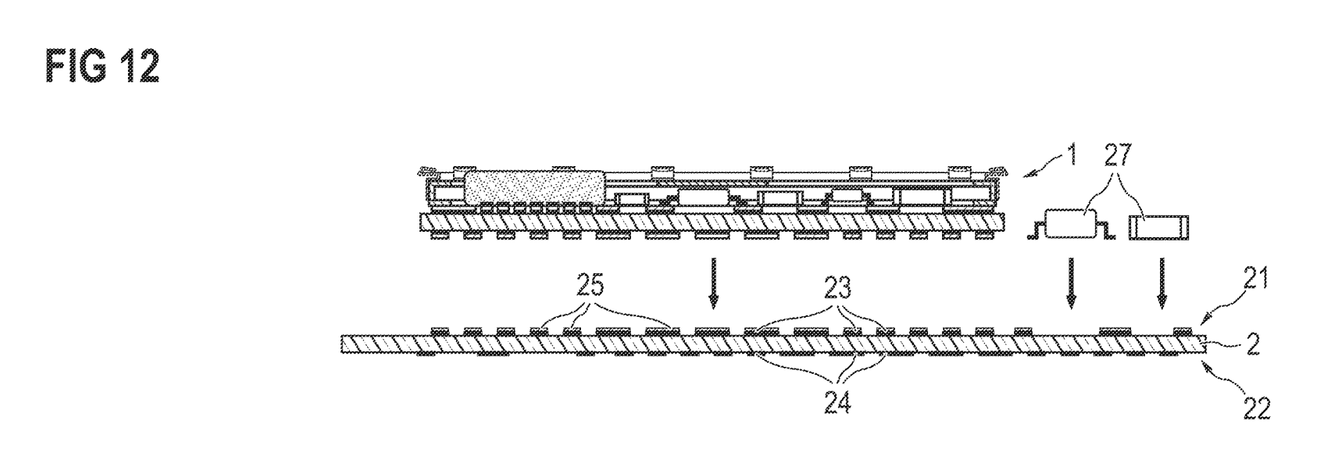
Figure 13:
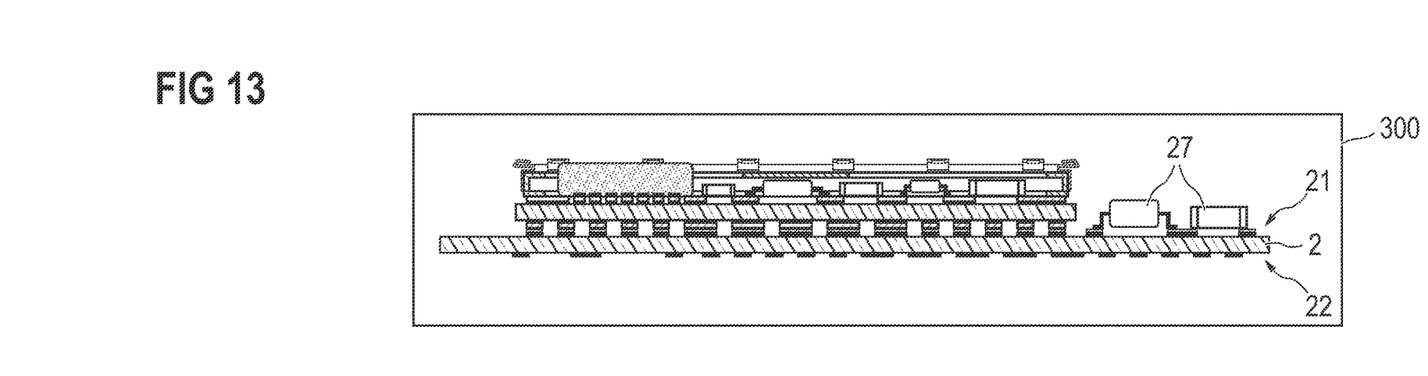
Figure 14:
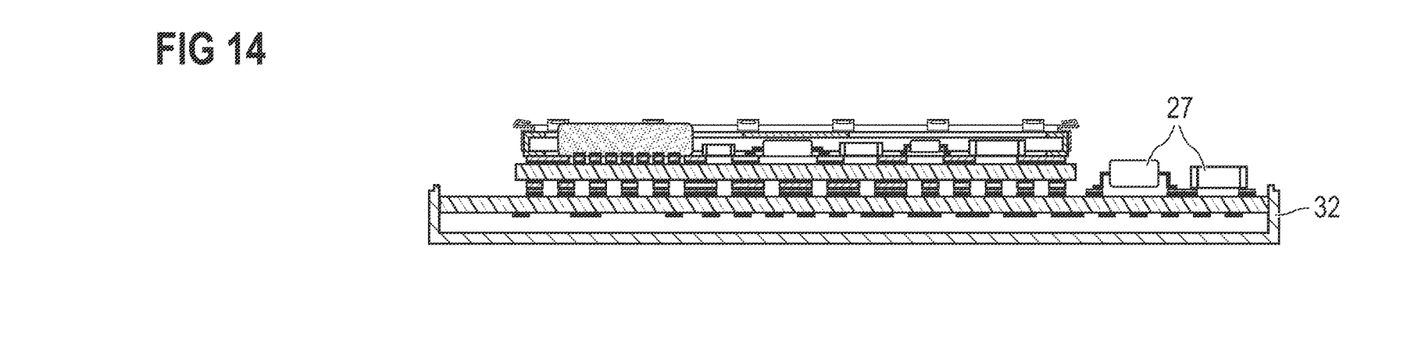

In order to produce a circuit board arrangement 200, a third solder 25 (e.g., a soldering paste) is applied over the top metallization layer 23, for instance by means of dispensing, screen printing or mask printing. The result is illustrated in FIG. 11. Then, according to FIG. 12, the subunit 100 as described above and one ore more further arbitrary electronic components 27 are arranged on the applied third solder 25, for instance in a pick-and-place process. Subsequently, the second circuit board 2 with the third solder 25 and the subunit 100 and the further arbitrary electronic components 27 arranged on the third solder 25 are arranged in one of the previous or a further reflow soldering machine 300 (e.g., see FIG. 13, in which the third solder 25 is melted and subsequently cooled to below its solidification temperature). As a result, the subunit 100 and the further arbitrary electronic components 27 are fixedly connected to the second circuit board 2. After the soldering process, the soldered arrangement may be removed from the reflow soldering machine 300 and optionally be mounted in a bottom housing 32, see FIG. 14.

Optionally, after the first solder 16 and the second solder 15 are cooled to below their respective solidification temperatures, a subunit which includes the first circuit board 1 with the top metallization layer 13 and the bottom metallization layer 14, the first solder 16, the second solder 15 and the number of electronic components 17 but not the shielding frame 18, the thermal interface material 4 and the housing cover 31, may have a weight such that the ratio between the mass of the subunit and the total surface area $A141_{tot}$ is less than or equal to 0.08 g/mm$^2$. This allows soldering further electronic components to the bottom metallization 24 of the bottom metallization layer 24 of the second circuit board 2 with the subunit already soldered to the top metallization layer 23 and with the second circuit board 2 top side 23 down (i.e., facing towards earth) in a reflow soldering process. Due to the low weight of such a subunit, it will not drop down from the second circuit board 2.

Figure 15:
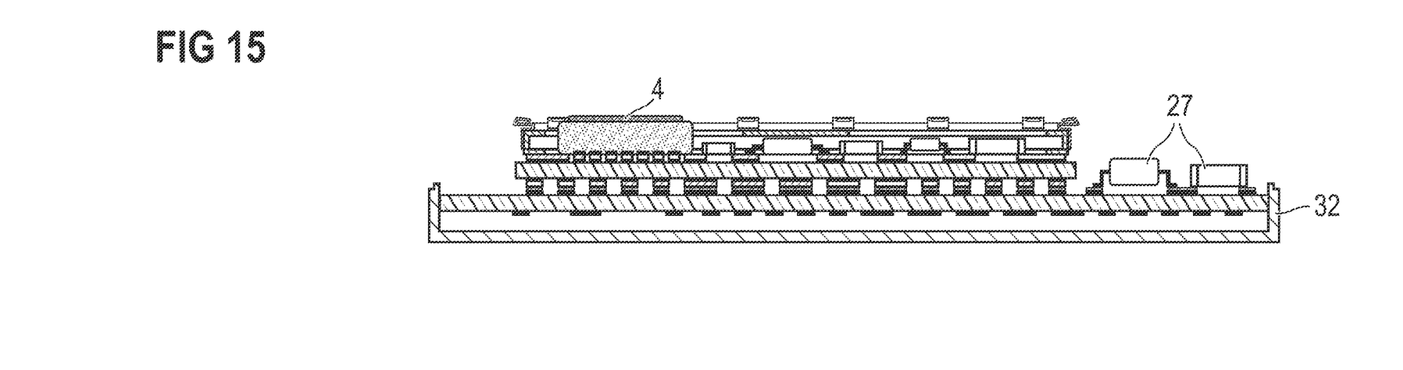

In any case, a thermal interface material 4, for instance a thermal interface paste or a self-adhesive thermal interface pad, is arranged on the top side of at least one of the electronic components 17, that is, on that side of the respective at least one electronic component 17 facing away from the first circuit board 1 (e.g., see FIG. 15). The thermal interface material 4 is applied after the last of all above mentioned soldering processes, as far as such soldering processes are used.

Regardless of whether the soldered arrangement is mounted in a bottom housing 32 or not, the thermal interface material 4 may be arranged on the respective electronic components 17 prior to or after snapping the spring frame 19 onto the shielding frame 18.

Figure 16:
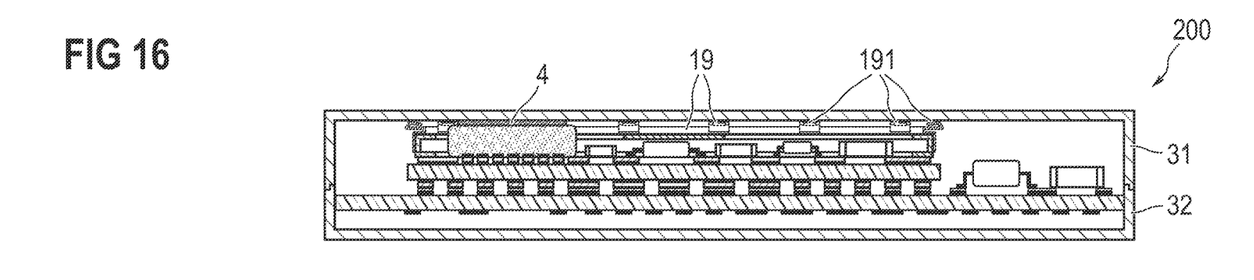

Finally, as illustrated in FIG. 16, a housing cover 31 with an electrically conductive surface is attached to the first circuit board 1 such that the contact springs 191 of the spring frame 19 electrically contact the housing cover 31, and that the thermal interface material 4 mechanically contacts the housing cover 31 and at least one of the electronic components 17. Hence, the electronic components 17 provided with the thermal interface material 4 are efficiently cooled by the housing cover 31. That is, the housing cover 31 acts both as a heat sink and, due to its electrically conductive surface, as an electromagnetic shielding. For example, the housing cover 31 may be made of a bent thin sheet-metal with a thickness D19 (see FIG. 3), for instance 0.1 mm to 0.2 mm (e.g., about 0.15 mm).

Figure 17:
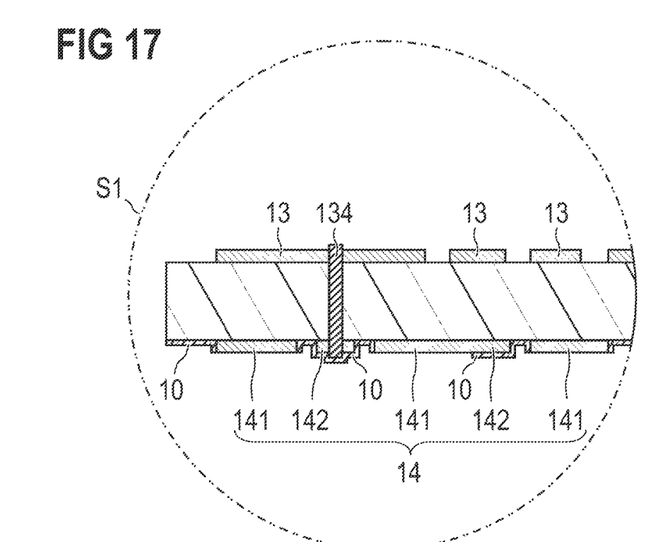
FIG. 17 is an enlarged section of the circuit board of the circuit board system as explained above with reference to FIG. 1.

FIG. 17 is an enlarged view of a section S1 of the first circuit board 1 illustrated in FIG. 3. The bottom metallization layer 14 includes soldering pads 141 and conductive lines 142. The conductive lines 142 serve to electrically connect the soldering pads 141. A solder mask 10 covers the conductive lines 142 but not the soldering pads 141. Metallic vias 134 are used to electrically interconnect different metallization layers 13, 14 of the first circuit board 1. Optionally, the first circuit board 1 may include one or more additional metallization layers between the top metallization layer 13 and the bottom metallization layer 14. For instance, a first circuit board 1 may have, including the top and bottom metallization layers 13, 14, four or eight metallization layers, one above the other. In cases where a first circuit board 1 has three or more metallization layers, metallic vias 134 may be used to electrically interconnect any two of the metallization layers of the first circuit board 1.

According to one embodiment, none of all metallic vias 134 of the first circuit board 1 is formed in the area of a soldering pad 141 of the bottom metallization layer 14. In other words, any electric connection between a metallic via 134 of the first circuit board 1 and a soldering pad 141 of the bottom metallization 14 is realized via a conductor line 142 formed in the bottom metallization layer 14. There is no direct electric contact between a metallic via 134 of the first circuit board 1 and a soldering pad 141.

Alternatively, a via may be formed in the area of a soldering pad 141, then filled with electrically conductive material, and grinded in order to achieve a flat surface of the soldering pad 141.

Figure 18:
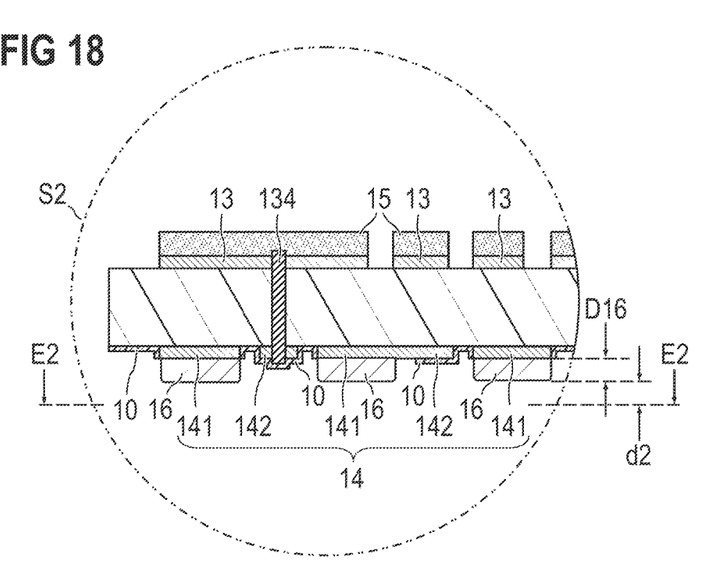
FIG. 18 is an enlarged section of the circuit board of the circuit board system as explained above with reference to FIG. 1, wherein a first solder is applied over the soldering pads and a second solder is applied over the top metallization layer.

FIG. 18 is an enlarged view of a section S2 of the first circuit board 1 illustrated in FIG. 6. The sections S1 and S2 are identical, however, in the arrangement of FIGS. 6 and 18 (S2) there is a first solder 16 applied over the soldering pads 141 and a second solder 15 applied over the top metallization layer 13. Although the second solder 15 is still present as a paste, the first solder 16 has already undergone a reflow and a subsequent cooling and solidification process as described above with reference to FIGS. 4 and 5. Optionally, the (structured) first solder layer 16 may have an average thickness D16 of at least 100 μm. According to a further option which is independent from an average thickness of the first solder layer 16, there may exist a plane E2 hich does not intersect the first solder 16 with the secondary condition that for each of the soldering pads 141, the distance d2 between the plane E2 and that section of the first solder 16 arranged above the respective soldering pad 141 is less than 100 μm.

FIG. 19 again shows an exploded view of a circuit board system 100 as explained above. From this view it can be seen that the shielding frame 18 may include a ring-shaped section and a cross-like section 181 arranged inside the ring-shaped section. The cross-like section 181 may be used in a pick-and-place process, in which the shielding frame 18 is placed on the second solder 15 as described above with reference to FIG. 7. The cross-like section 181 may include a point of application which is used by a pick-and-place machine in the pick-and-place process.

Figure 19:
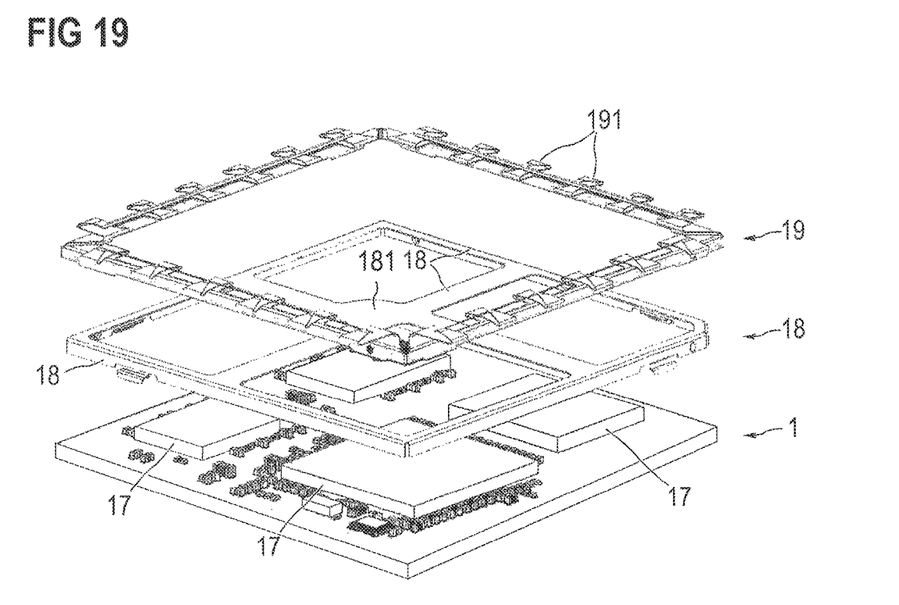
FIG. 19 is a another exploded view of the circuit board system of FIG. 1.
Figure 20:
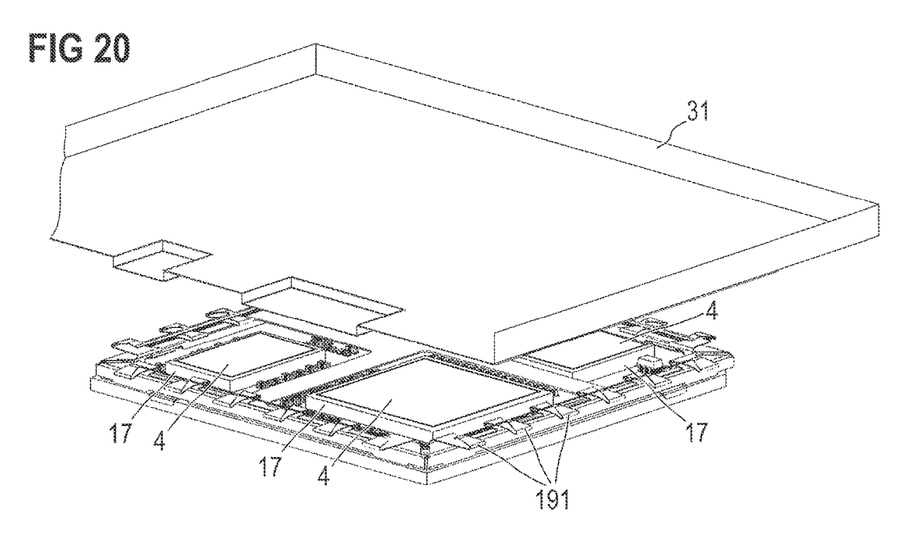
FIG. 20 is an exploded view of a circuit board system explained above with reference to FIGS. 1 to 3 prior to being thermally coupled to a housing lid.

FIG. 20 shows the arrangement of FIG. 19 in the assembled state, with a thermal interface material 4 applied over the top sides of some of the electronic components 17 and with a housing cover 31 to be mounted on the circuit board system 100.

Figure 21:
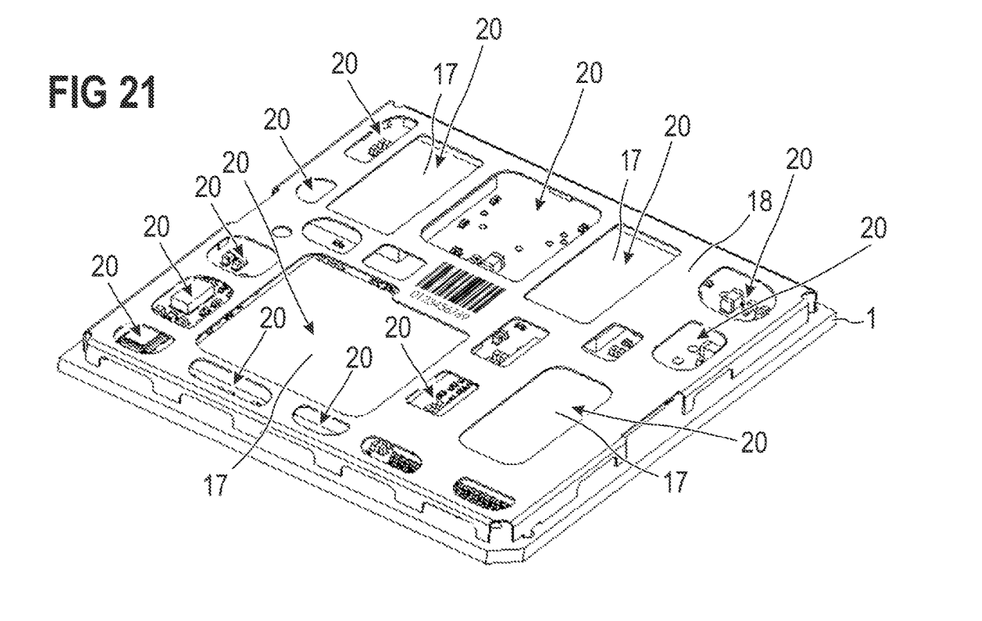
FIG. 21 is a perspective view of a first circuit board populated with a number of electronic components and a shielding frame that includes openings.
Figure 22:
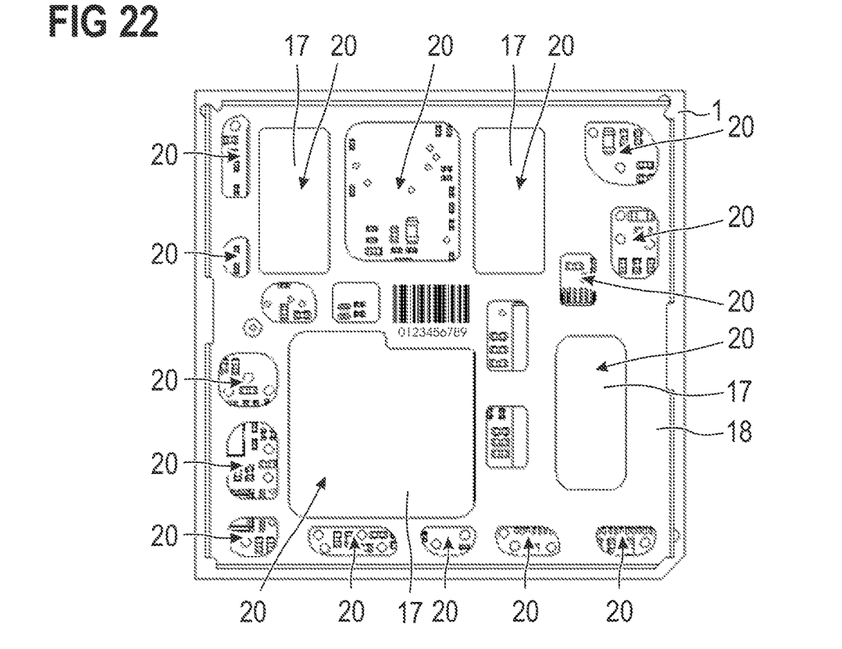
FIG. 22 is a top view of the first circuit board of FIG. 21.

FIG. 21 is a perspective view of a further example of a first circuit board 1 that is populated with a number of electronic components. A shielding frame 18 with several openings 20 is soldered to the first circuit board 1. Underneath one or more of the openings 20, electronic components such as processors, power transistors etc. with flat large area top sides (e.g., at least 30 mm$^2$ each) are arranged. FIG. 22 is a top view of the first circuit board of FIG. 21.

Figure 23:
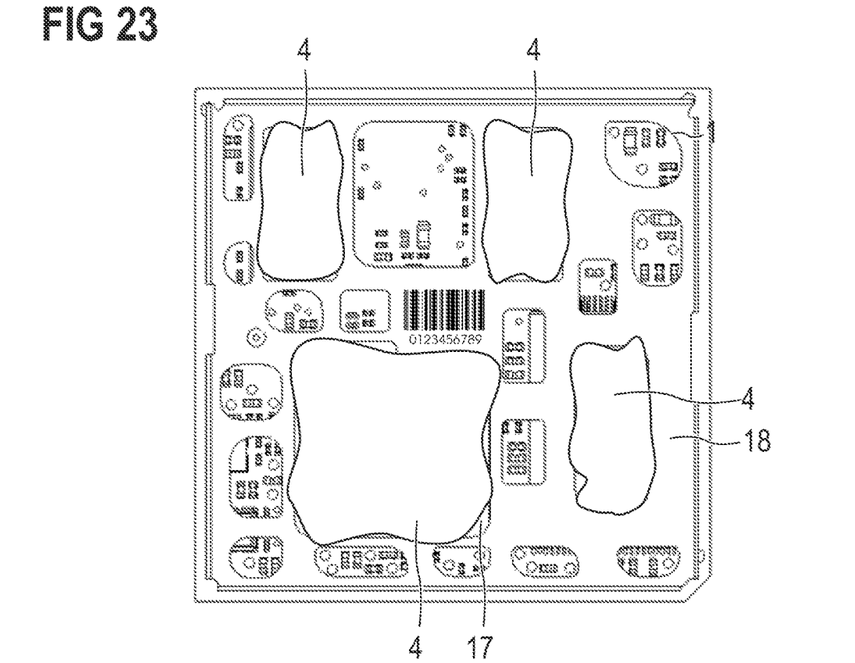
FIG. 23 is a top view of the first circuit board of FIGS. 21 and 22 with a thermal interface material applied through some of the openings over the top sides of some electronic components.

In order to provide for sufficient cooling of the electronic components, a thermal interface material 4 is applied through some of the openings 20 over the top sides of some of the electronic components 17 underneath the openings 20. The thermal interface material 4 allows thermally coupling the respective electronic components to a heat sink or a housing cover. As the thermal interface material 4 is applied after the soldering process in which the first circuit board 1 is populated with the electronic components and the shielding frame 18, the thermal interface material 4 (e.g., a thermal interface paste or a self-adhesive thermal interface pad) is not exposed to the high temperatures of the soldering process. Through this, degradation of the thermal interface material 4 is avoided.

Figure 24:
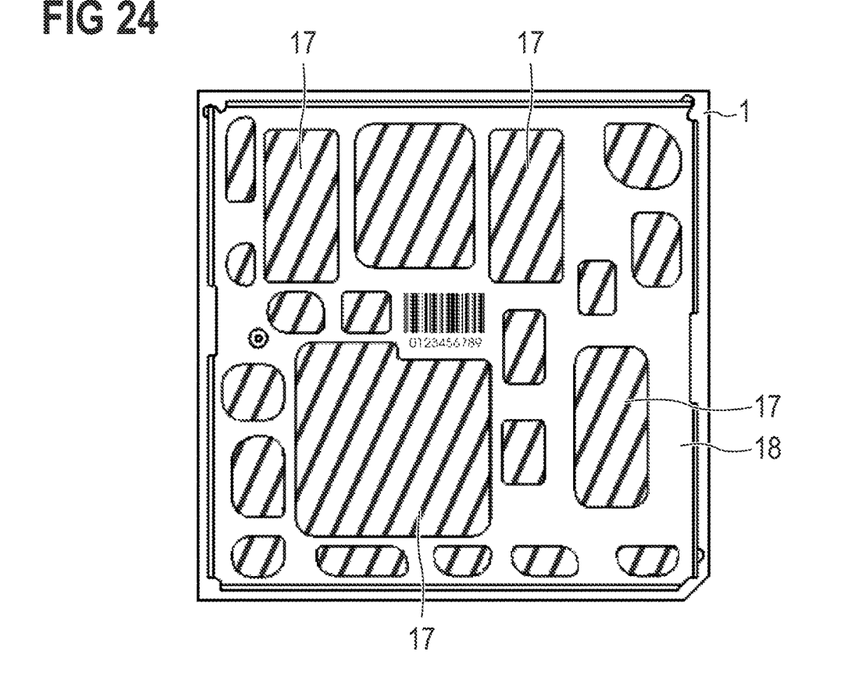
FIG. 24 is a top view of the first circuit board of FIGS. 21 to 23 that schematically illustrates the openings formed in the shielding frame.

In FIG. 24, the openings 20 are schematically shown in a hatched manner. In order to achieve a sufficient shielding effect, the total footprint area of all openings 20 may be less than 30% of the footprint area of the first circuit board 1. Hereby, the footprint area of the openings 20 is taken in the plane of the top side 11 of the first circuit board 1. The footprint area of the first circuit board 1 is basically the area of its top side 11.

According to a further option also illustrated in FIGS. 21 to 24, the shielding frame 18 may be provided with a bar code. For this, the bar code may be directly printed onto the shielding frame 18, or attached to the shielding frame 18 by means of an adhesive label that shows the bar code.

A circuit board system or arrangement as described above may be used in any arbitrary technical field, for instance in automotive applications such as in a head unit of an infotainment system or in a telematic unit. Such a telematic unit may include, for instance, one or—in any combination—some or all of the following functions: emergency call; modem; wireless hot spot; stolen vehicle tracking; global positioning system (GPS).

While exemplary embodiments are described above, it is not intended that these embodiments describe all possible forms of the invention. Rather, the words used in the specification are words of description rather than limitation, and it is understood that various changes may be made without departing from the spirit and scope of the invention.

Additionally, the features of various implementing embodiments may be combined to form further embodiments of the invention.

What is claimed is:

1. A method for producing a circuit board system comprising:
   providing a first circuit board comprising a top side, a bottom side, a top metallization layer arranged at the top side, and a bottom metallization layer arranged at the bottom side, wherein the bottom metallization layer comprises a number of soldering pads;
   applying a first solder over the soldering pads;
   applying a second solder over the top metallization layer;
   providing a number of electronic components, and a metallic or metallized shielding frame having openings;
   arranging the number of electronic components and the shielding frame on the applied second solder;
   soldering the number of electronic components and the shielding frame to the top metallization layer by melting the second solder and by subsequently cooling the second solder to a temperature that is below a solidification temperature;
   applying, after cooling, a thermal interface material through at least one of the openings of the shielding frame over a top side of at least one of the electronic components;
   providing a housing cover; and
   attaching the housing cover to the first circuit board such that the thermal interface material mechanically contacts the housing cover and the at least one of the electronic components.

2. The method of claim 1, wherein the first solder is, after applying the first solder over the soldering pads and prior to applying the second solder over the top metallization layer, melted and subsequently cooled to a temperature that is below a solidification temperature.

3. The method of claim 2, wherein the first solder forms, after being cooled to the temperature that is below the solidification temperature, a structured first solder layer with an average thickness of at least 100 μm.

4. The method of claim 2, wherein, after the first solder is cooled to the temperature that is below the solidification temperature,
   a plane is provided that does not intersect the first solder;
   for each of the soldering pads, a distance between the plane and a section of the first solder arranged above the respective soldering pad is less than 100 μm.

5. The method of claim 2, wherein
   a total number of soldering pads has a total surface area;
   after the first solder and the second solder are cooled to their respective temperatures that are below their respective solidification temperatures, a subunit comprising the first circuit board with the top metallization layer and the bottom metallization layer, the first solder, the second solder and the number of electronic components but without the shielding frame, without the thermal interface material and without a housing cover is formed; and
   a ratio between a mass of the subunit and the total surface area is less than or equal to 0.08 g/mm$^2$.

6. The method of claim 1, wherein
   a first subset of the soldering pads has a first pitch of at least 2.4 mm; and
   a second subset of the soldering pads has a second pitch of at least 3 mm, the second pitch being different from the first pitch.

7. The method of claim 1, wherein the first circuit board comprises a footprint of less than or equal to 70 mm×70 mm.

8. The method of claim 1, wherein a total footprint area of all openings is less than 30% of a footprint area of the first circuit board.

9. The method of claim 1, further comprising:
   providing a metallic or metallized spring frame including an electrically conductive surface and several electrically conductive contact springs; and
   snapping the spring frame onto the shielding frame.

* * * * *